US010985060B2

(12) United States Patent
Morikazu

(10) Patent No.: US 10,985,060 B2
(45) Date of Patent: Apr. 20, 2021

(54) LASER PROCESSING METHOD USING PLASMA LIGHT DETECTION FOR FORMING A PORE IN A SUBSTRATE

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/600,739

(22) Filed: Oct. 14, 2019

(65) Prior Publication Data

US 2020/0126856 A1  Apr. 23, 2020

(30) Foreign Application Priority Data

Oct. 23, 2018  (JP) .............................. JP2018-199132

(51) Int. Cl.
*H01L 21/768* (2006.01)
*H01L 21/02* (2006.01)
*H01L 21/428* (2006.01)

(52) U.S. Cl.
CPC .. *H01L 21/76894* (2013.01); *H01L 21/02203* (2013.01); *H01L 21/428* (2013.01)

(58) Field of Classification Search
CPC ......... H01L 21/76894; H01L 21/02203; H01L 21/428
See application file for complete search history.

(56) References Cited

U.S. PATENT DOCUMENTS 7,602,822 B2  10/2009  Lizotte et al.
7,776,720 B2   8/2010  Boyle et al.

9,293,409 B2     3/2016  Fischer et al.
2007/0045779 A1  3/2007  Hiatt
2008/0242052 A1 10/2008  Feng et al.
(Continued)

FOREIGN PATENT DOCUMENTS

JP    2013184213 A    9/2013

OTHER PUBLICATIONS

Richard F. Toftness et al., ""Laser technology for wafer dicing and micro-via drilling for next generation wafers"" Proceedings of SPI E, u 5713, Photon Processing in Microelectronics and Photonics IV, Event: Lasers and Applications in Science and Engineering, Apr. 12, 2005 (Year: 2005).

(Continued)

*Primary Examiner* — Michael Jung
(74) *Attorney, Agent, or Firm* — Greer, Burns & Crain, Ltd.

(57) ABSTRACT

A laser processing method for applying a laser beam to the reverse side of a substrate with a device formed on a face side thereof and including an electrode pad, to form a pore in the substrate that leads to the electrode pad, includes an irradiation area setting step of detecting the size of the electrode pad and setting an irradiation area for the laser beam such that the pore to be formed is positioned within the electrode pad. After the irradiation area setting step has been performed, the laser beam is applied to the reverse side of the substrate to form a pore in the substrate at a position corresponding to the electrode pad. First plasma light emitted from the substrate and second plasma light emitted from the electrode pad are detected. When the second plasma light is detected, the beam is stopped from being applied to the substrate.

4 Claims, 4 Drawing Sheets

(56) References Cited

U.S. PATENT DOCUMENTS

| | | | |
|---|---|---|---|
| 2009/0127233 A1* | 5/2009 | Asano | G01N 21/73 |
| | | | 219/121.7 |
| 2011/0240617 A1 | 10/2011 | Xu et al. | |
| 2012/0298636 A1* | 11/2012 | Nomaru | B23K 26/382 |
| | | | 219/121.61 |
| 2013/0048617 A1* | 2/2013 | Morikazu | B23K 26/361 |
| | | | 219/121.71 |
| 2013/0092669 A1* | 4/2013 | Morikazu | B23K 26/0853 |
| | | | 219/121.67 |
| 2013/0193122 A1* | 8/2013 | Nomaru | B23K 26/384 |
| | | | 219/121.62 |
| 2013/0206736 A1* | 8/2013 | Morikazu | B23K 26/389 |
| | | | 219/121.62 |
| 2013/0213946 A1* | 8/2013 | Morikazu | B23K 26/40 |
| | | | 219/121.85 |
| 2013/0256279 A1* | 10/2013 | Morikazu | B23K 26/389 |
| | | | 219/121.61 |
| 2013/0288425 A1 | 10/2013 | Rana et al. | |
| 2014/0299367 A1 | 10/2014 | Imamura | |

OTHER PUBLICATIONS

Morikazu, Hiroshi, U.S. Appl. No. 16/599,809, filed Oct. 11, 2019.
Morikazu, Hiroshi, U.S. Appl. No. 16/601,077, filed Oct. 14, 2019.

* cited by examiner

LASER PROCESSING METHOD USING PLASMA LIGHT DETECTION FOR FORMING A PORE IN A SUBSTRATE

BACKGROUND OF THE INVENTION

Field of the Invention

The present invention relates to a laser processing method for applying a laser beam to the reverse side of a substrate to form a pore in the substrate that leads to an electrode pad thereon.

Description of the Related Art

Wafers with a plurality of devices such as integrated circuits (ICs), large-scale integrated (LSI) circuits formed on face sides thereof in respective areas demarcated by a grid of intersecting projected dicing lines are divided into individual device chips by a dicing apparatus or a laser processing apparatus, and the divided device chips will be used in electric equipment such as mobile phones and personal computers.

In recent years, it has been customary to form a pore in a substrate with such devices disposed thereon from the reverse side of the substrate, the pore reaching the reverse sides of electrode pads of the devices. After the pore has been formed, it is made into a via hole by being filled up with an electrically conductive material such as aluminum. Devices are layered over and under the via holes to improve their performance.

The present applicant has proposed a technology for applying a laser beam to the reverse side of a substrate at a position corresponding to the electrode pad on a device on the substrate to form the pore described above (see Japanese Patent No. 6034030). According to the technology disclosed in Japanese Patent No. 6034030, the arrival of the laser beam at the electrode pad is determined by detecting plasma light that is emitted when the laser beam is applied to the reverse side of the substrate with devices formed on its face side, and plasma light that is emitted when the laser beam reaches the electrode pad. When the arrival of the laser beam at the electrode pad is determined by the plasma light, application of the laser beam is stopped without making a hole in the electrode pad.

SUMMARY OF THE INVENTION

According to the above related art, when the laser beam applied to the substrate from the reverse side thereof reaches the electrode pad, plasma light that is inherent in the material of which the electrode pad is made is emitted. The laser beam is stopped when the plasma light inherent in the electrode pad material is detected. However, since the spot diameter of the laser beam is set to be smaller than the area of the electrode pad, in order to reliably connect the electrically conductive material that will fill up the pore subsequently to the electrode pad, it is necessary to apply the laser beam repeatedly a certain number of times after the laser beam has reached the electrode pad for the first time for the purpose of exposing a sufficient area of the electrode pad.

On the other hand, the electrode pad formed on the device has a small area per se. If the laser beam is applied over an area covering the electrode pad in its entirety, then the laser beam tends to be applied to the substrate even after the electrode pad has been exposed to a certain degree. At this time, as the plasma light that is inherent in the material of which the substrate is made is continuously emitted, the plasma light that is inherent in the material of which the electrode pad is made cannot be detected sufficiently. As a result, the laser beam is excessively applied to the electrode pad, forming a hole in the electrode pad. It is thus difficult to properly form a pore in the substrate.

It is therefore an object of the present invention to provide a laser processing method that is capable of properly forming a pore in a substrate by applying a laser beam to the reverse side of the substrate at a position corresponding to the electrode pad on a device on the substrate.

In accordance with an aspect of the present invention, there is provided a laser processing method for applying a laser beam to the reverse side of a substrate with a device formed on a face side thereof and including an electrode pad, to form a pore in the substrate that leads to the electrode pad, including an irradiation area setting step of detecting the size of the electrode pad and setting an irradiation area for the laser beam such that the pore to be formed is positioned within the electrode pad, after the irradiation area setting step, a laser beam applying step of applying the laser beam to the reverse side of the substrate to form a pore in the substrate at a position corresponding to the electrode pad, a detecting step of detecting first plasma light emitted from the substrate at the same time when the pore is formed in the substrate by the laser beam applied thereto, and second plasma light emitted from the electrode pad, and a laser beam irradiation finishing step of stopping application of the laser beam when the second plasma light is detected in the detecting step.

Preferably, in the irradiation area setting step, the irradiation area for the laser beam is set such that the pore formed in the substrate and leading to the electrode pad has a cross-sectional area that is equal to or less than 95% of the area of a circle inscribed in the electrode pad.

With the laser processing method according to the present invention, since the size of the electrode pad is detected and the irradiation area for the laser beam is set such that the pore to be formed is positioned within the electrode pad, before the laser beam applying step, when the pore has reached the electrode pad, the laser beam is reliably applied to the electrode pad, causing the electrode pad to emit sufficient second plasma light. The laser beam is stopped from being applied to the substrate upon detection of the second plasma light. Consequently, the problem of a hole being formed in the electrode pad is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
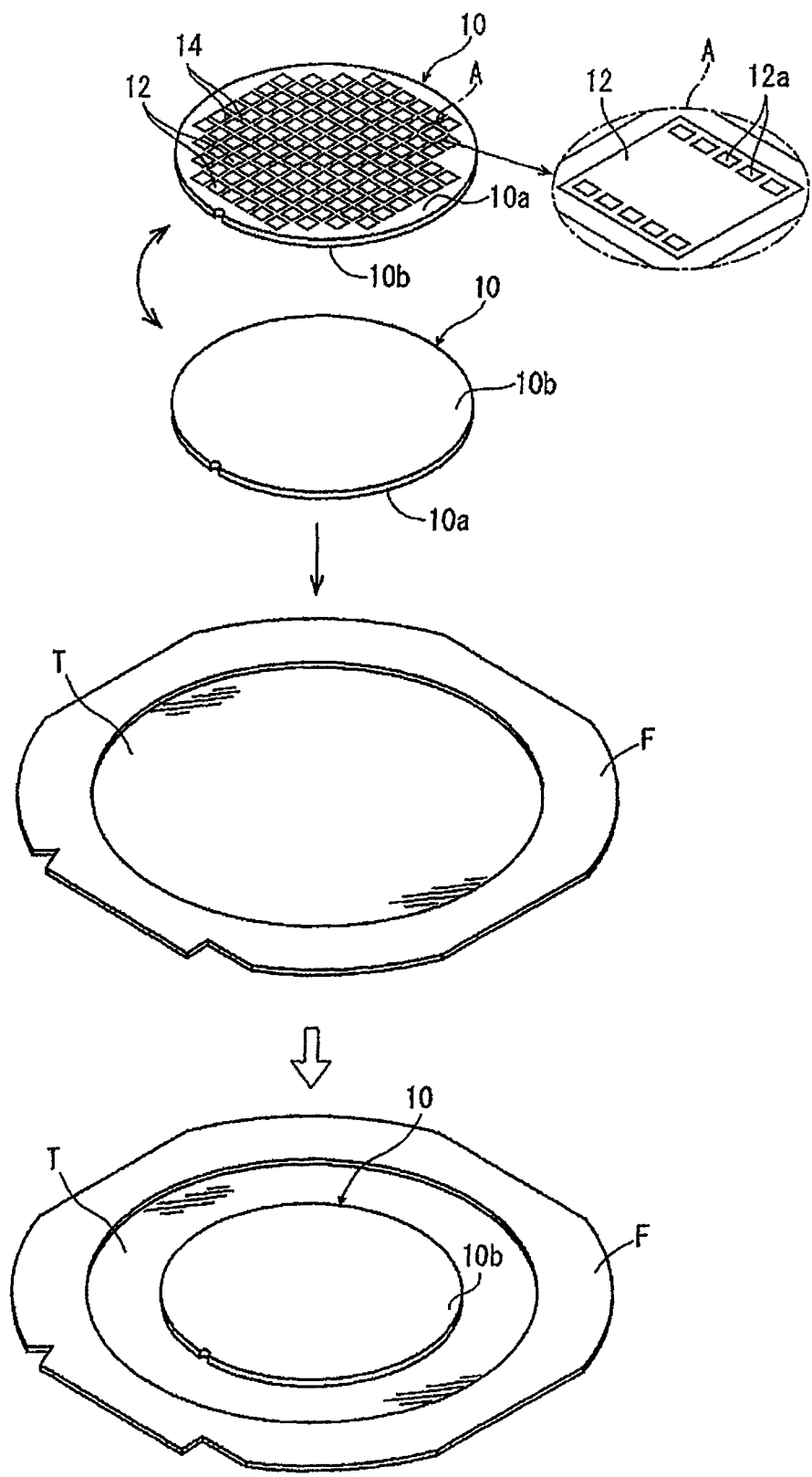
FIG. 1 is a perspective view of a substrate as a workpiece according to an embodiment of the present invention, the view also illustrating the manner in which the substrate is supported on an annular frame.

A laser processing method according to an embodiment of the present invention will be described in detail below with reference to the accompanying drawings. FIG. 1 illustrates a perspective view of a disk-shaped substrate 10 according to an embodiment of the present invention, which is prepared as a workpiece to be processed by a laser beam. The substrate 10 illustrated in FIG. 1 is, for example, made of lithium tantalate (LT) and has a thickness of 300 µm. The substrate 10 has a plurality of areas on a face side 10a thereof that is demarcated by a grid of projected dicing lines 14, with devices 12 formed respectively in the demarcated areas. As illustrated at an enlarged scale of a portion A in FIG. 1 on the right side, each of the devices 12 includes a plurality of (10) electrode pads 12a on its face side, each having a substantially rectangular shape. Each of the electrode pads 12a has a size of approximately 500 µm×600 µm, and is made of copper (Cu) according to the present embodiment. As illustrated in FIG. 1, the prepared substrate 10 is supported, with its face side 10a down and its reverse side 10b up, on an annular frame F by a protective tape T mounted on the annular frame F.

Figure 2:
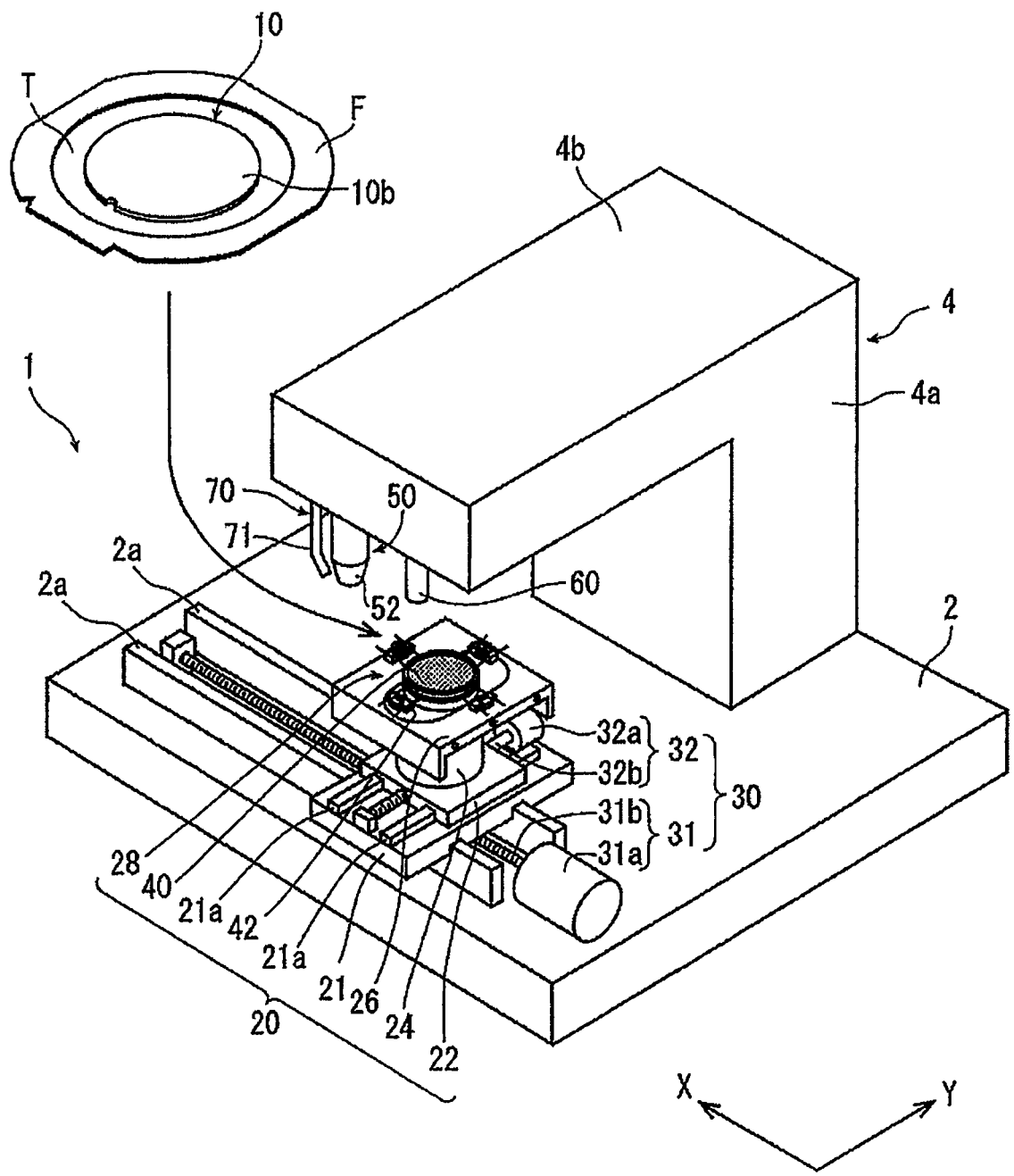
FIG. 2 is an overall perspective view of a laser processing apparatus that performs a laser processing method according to the embodiment on the substrate illustrated in FIG. 1.

FIG. 2 illustrates a perspective view of a laser processing apparatus 1 in its entirety that applies a laser beam to the substrate 10 according to the present embodiment. The laser processing apparatus 1 includes a holding unit 20 for holding the substrate 10 supported on the annular frame F by the protective tape T, a moving mechanism 30 for moving the holding unit 20, a laser beam applying unit 50 for processing, with a laser beam, the substrate 10 held by the holding unit 20, an image capturing unit 60 for capturing an image of the substrate 10 held by the holding unit 20, and a plasma light detecting unit 70 for detecting plasma light emitted from the substrate 10.

The holding unit 20 includes a rectangular X-axis movable plate 21 placed on a base table 2 for movement along X-axis directions indicated by an arrow X in FIG. 2, a rectangular Y-axis movable plate 22 placed on the X-axis movable plate 21 for movement along Y-axis directions indicated by an arrow Y that extend perpendicularly to the X-axis directions, the X-axis directions and the Y-axis directions jointly defining a substantially horizontal plane, a hollow cylindrical support post 24 fixedly mounted on an upper surface of the Y-axis movable plate 22, and a rectangular cover plate 26 fixed to an upper end of the support post 24. The cover plate 26 has an oblong hole defined therein through which a circular chuck table 28 extends upwardly. The chuck table 28 that supports the substrate 10 thereon is rotatable about its own vertical axis by rotary actuator means, not illustrated, housed in the support post 24. A circular suction chuck 40 that is made of a porous material and lies substantially horizontally is disposed on an upper surface of the chuck table 28. The suction chuck 40 is connected to suction means, not illustrated, through a fluid channel extending through the support post 24. A plurality of clamps 42 for securing the frame F that supports the substrate 10 is disposed on the chuck table 28.

The moving mechanism 30 disposed on the base table 2 functions as means for moving the holding unit 20 and the laser beam applying unit 50 relatively to each other. The moving mechanism 30 includes an X-axis moving mechanism 31 that processing-feeds the holding unit 20 in the X-axis directions and a Y-axis moving mechanism 32 that indexing-feeds the holding unit 20 in the Y-axis directions. The X-axis moving mechanism 31 converts rotary motion of a stepping motor 31a into linear motion through a ball screw 31b and transmits the linear motion to the X-axis movable plate 21, thereby moving the X-axis movable plate 21 in one of the X-axis directions or the other along a pair of guide rails 2a on the base table 2. The Y-axis moving mechanism 32 converts rotary motion of a stepping motor 32a into linear motion through a ball screw 32b and transmits the linear motion to the Y-axis movable plate 22, thereby moving the Y-axis movable plate 22 in one of the Y-axis directions or the other along a pair of guide rails 21a on the X-axis movable plate 21. The rotary actuator means, not illustrated, housed in the support post 24 is able to control the positions of the chuck table 28 by rotating the chuck table 28 about its own vertical axis through a desired angular interval. Although not illustrated, the X-axis moving mechanism 31, the Y-axis moving mechanism 32, and the rotary actuator means are associated with respective position detecting means. The position detecting means accurately detects the position along the X-axis directions, the position along the Y-axis directions, and the angular position of the chuck table 28 on the base table 2, and transmits the detected positions to a control unit 100 (see FIG. 3), to be described later. Based on the detected positions, the control unit 100 issues command signals to actuate the X-axis moving mechanism 31, the Y-axis moving mechanism 32, and the rotary actuator means not illustrated to control the positions of the chuck table 28 to reach a desired X-coordinate position, a desired Y-coordinate position, and a desired angular position θ.

An upstanding frame body 4 is mounted on the base table 2 laterally of the moving mechanism 30. The frame body 4 includes a vertical wall 4a disposed on the base table 2 and a horizontal wall 4b extending horizontally from an upper end portion of the vertical wall 4a in overhanging relation to the holding unit 20. The horizontal wall 4b of the frame body 4 houses therein an optical system, not illustrated, of the laser beam applying unit 50. The laser beam applying unit 50 includes a beam condenser 52 disposed on a lower surface of a distal end portion of the horizontal wall 4b. A laser beam emitted from the beam condenser 52 of the laser beam applying unit 50 is applied to a desired position on the substrate 10 held by the holding unit 20.

Figure 3:
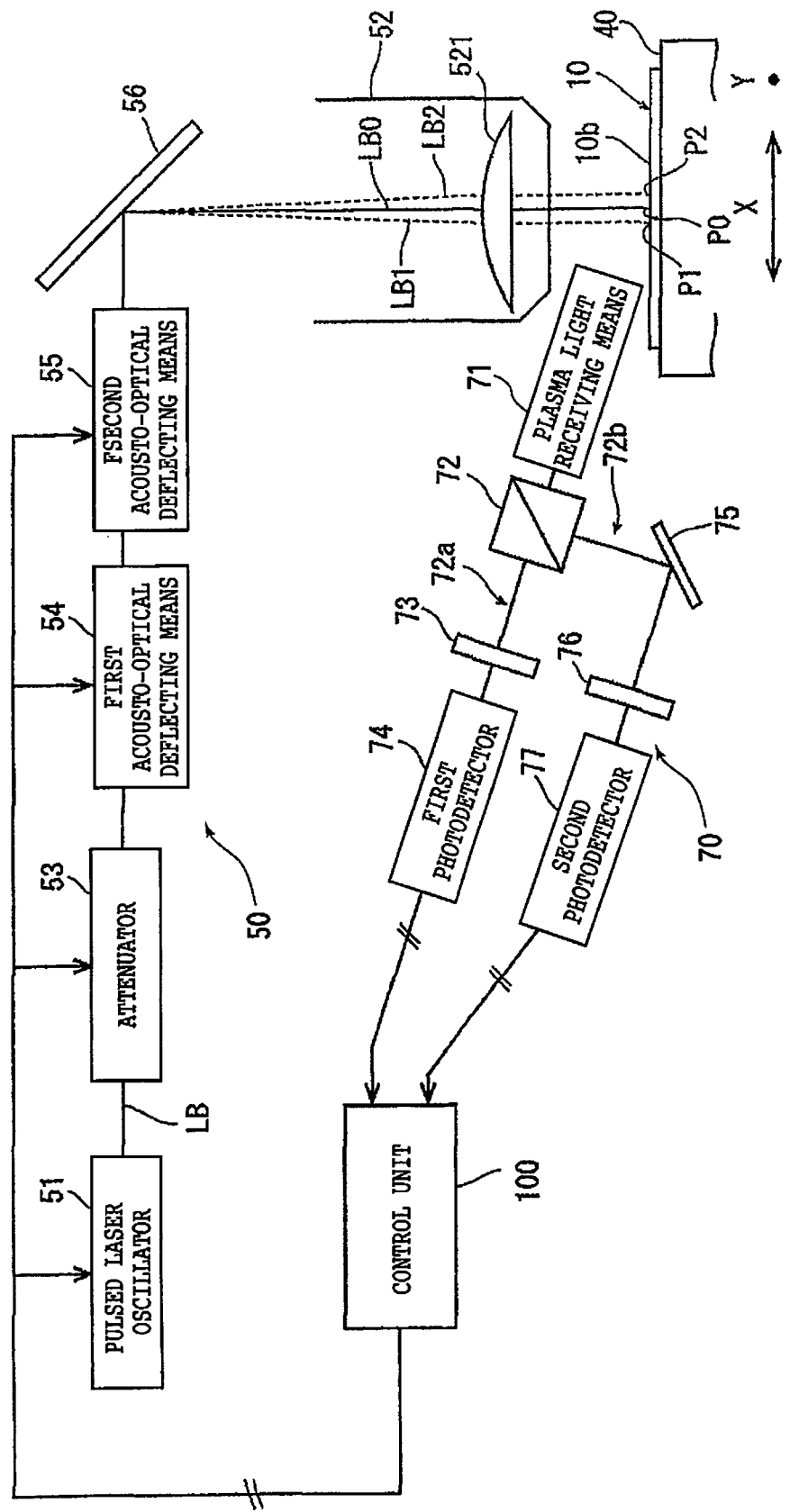
FIG. 3 is a block diagram illustrating general makeups of a laser beam applying unit and a plasma light detecting unit of the laser processing apparatus illustrated in FIG. 2.

As illustrated in FIG. 3, the laser beam applying unit 50 includes a pulsed laser oscillator 51 for emitting a pulsed laser beam LB, an attenuator 53 for adjusting the output level of the pulsed laser beam LB emitted from the pulsed laser oscillator 51, first acousto-optical deflecting means 54 including at least an acousto-optical device as optical deflecting means, not illustrated, for deflecting the optical path of the pulsed laser beam LB in given processing-feed directions, i.e., the X-axis directions, second acousto-optical deflecting means 55 including at least an acousto-optical device as optical deflecting means, not illustrated, for deflecting the optical path of the pulsed laser beam LB in given indexing-feed directions, i.e., the Y-axis directions, and a reflecting mirror 56 for changing the direction of the optical path of the pulsed laser beam LB from the second acousto-optical deflecting means 55 to guide to the beam condenser 52, which includes an fθlens, the optical path of the pulsed laser beam LB reflected from the reflecting mirror 56. The pulsed laser oscillator 51, the attenuator 53, the first acousto-optical deflecting means 54, and the second acousto-optical deflecting means 55 described above are connected to the control unit 100 and controlled by command signals transmitted from the control unit 100.

If the control unit 100 applies a voltage of 5 V, for example, to the first acousto-optical deflecting means 54, applying a frequency corresponding to 5 V to the acousto-optical device, not illustrated, then the optical path of the pulsed laser beam LB emitted from the pulsed laser oscillator 51 is deflected to an optical path LB1, along which the pulsed laser beam LB travels and is focused on a focused spot P1 on the substrate 10 in FIG. 3. If the control unit 100 applies a voltage of 10 V, for example, to the first acousto-optical deflecting means 54, applying a frequency corresponding to 10 V to the acousto-optical device, not illustrated, then the optical path of the pulsed laser beam LB emitted from the pulsed laser oscillator 51 is deflected to an optical path LB0, along which the pulsed laser beam LB travels along the optical path LB0 and is focused on a focused spot P0 on the substrate 10 that is shifted by a prescribed amount from the focused spot P1 to the right in FIG. 3 in the processing-feed directions, i.e., the X-axis directions. If the control unit 100 applies a voltage of 15 V, for example, to the first acousto-optical deflecting means 54, applying a frequency corresponding to 15 V to the acousto-optical device, not illustrated, then the optical path of the pulsed laser beam LB emitted from the pulsed laser oscillator 51 is deflected to an optical path LB2, along which the pulsed laser beam LB travels and is focused on a focused spot P2 on the substrate 10 that is further shifted by a prescribed amount from the focused spot P0 to the right in FIG. 3 in the processing-feed directions, i.e., the X-axis directions.

The second acousto-optical deflecting means 55 is different from the first acousto-optical deflecting means 54 described above merely in that it deflects the optical path of the pulsed laser beam LB in the indexing-feed direction, i.e., the Y-axis directions, that are perpendicular to the sheet of FIG. 3. Otherwise, the second acousto-optical deflecting means 55 operates in the same manner as the first acousto-optical deflecting means 54. The pulsed laser beam LB can thus be deflected by the first acousto-optical deflecting means 54 and the second acousto-optical deflecting means 55 to any position within a predetermined range defined by the processing-feed directions, i.e., the X-axis directions, and the indexing-feed directions, i.e., the Y-axis directions, depending on the voltages applied thereto.

The control unit 100 is implemented by a computer and includes a central processing unit (CPU) for carrying out processing operations according to control programs, a read only memory (ROM) for storing, for example, control programs, a read/write random access memory (RAM) for storing, for example, detected values and results of processing operations, an input interface, and an output interface. To the control unit 100, there are connected not only the laser beam applying unit 50, but also the moving mechanism 30, the image capturing unit 60, the plasma light detecting unit 70, and the like which can be controlled by the command signals from the control unit 100.

The image capturing unit 60 is disposed on the lower surface of the distal end portion of the horizontal wall 4b at a position adjacent to the beam condenser 52 in one of the X-axis directions. The image capturing unit 60 includes an ordinary image capturing device for capturing an image with a visible beam of light, illuminating means for illuminating a workpiece, i.e., the substrate 10, an infrared image capturing device, and infrared ray applying means. Image information captured by the image capturing unit 60 is transmitted to the control unit 100. The image capturing unit 60 is used when the substrate 10 and the beam condenser 52 are brought into positional alignment with each other and also when the size and the like of each of the electrode pads 12a formed on the devices 12 are detected, at the time when the substrate 10 is to be processed with the laser beam LB.

The plasma light detecting unit 70 has its main portion housed in the horizontal wall 4b of the frame body 4. The plasma light detecting unit 70 includes plasma light receiving means 71 disposed on the lower surface of the distal end portion of the horizontal wall 4b at a position adjacent to the beam condenser 52 in the other X-axis direction opposite to the image capturing unit 60, as illustrated in FIG. 2. As illustrated in FIG. 3, the plasma light detecting unit 70 includes the plasma light receiving means 71 that receives plasma light generated when the pulsed laser beam LB is applied from the beam condenser 52 of the laser beam applying unit 50 to the substrate 10 held on the chuck table 28, a beam splitter 72 for separating the plasma light received by the plasma light receiving means 71 into first plasma light to travel along a first optical path 72a and second plasma light to travel along a second optical path 72b, a first bandpass filter 73 disposed in the first optical path 72a, for passing only light having a first set wavelength, i.e., the wavelength of the first plasma light that is emitted from lithium tantalate of which the substrate 10 is made, a first photodetector 74 for detecting the first plasma light that has passed through the first bandpass filter 73 and outputting a light intensity signal, a direction changing mirror 75 disposed in the second optical path 72b, a second bandpass filter 76 disposed in the second optical path 72b, for passing only light having a second set wavelength, i.e., the wavelength of the second plasma light that is emitted from copper of which the electrode pads 12a are made, the light whose direction has been changed by the direction changing mirror 75, and a second photodetector 77 for detecting the second plasma light that has passed through the second bandpass filter 76 and outputting a light intensity signal. The plasma light receiving means 71 described above includes a condensing lens, not illustrated, and a lens case, not illustrated, that houses the condensing lens.

The first bandpass filter 73 described above is able to pass light in a wavelength range from 660 to 680 nm as it passes only the wavelength, i.e., 670 nm, of the first plasma light emitted from lithium tantalate according to the present embodiment. The second bandpass filter 76 described above is able to pass light in a wavelength range from 510 to 520 nm as it passes only the wavelength, i.e., 515 nm, of the second plasma light emitted from copper according to the present embodiment. The plasma light detecting unit 70 according to the present embodiment is of the above makeup. The first photodetector 74 and the second photodetector 77 output respective signals that are representative of voltage values commensurate with the detected plasma light intensities to the control unit 100.

The laser processing apparatus 1 according to the present embodiment is generally arranged as described above. The laser processing method according to the present embodiment, which is carried out, using the laser processing apparatus 1 described above, to form a pore in the substrate 10 that reaches the electrode pads 12a from the reverse side 10b of the substrate 10 at positions corresponding to the electrode pads 12a of the devices 12 on the substrate 10, will be described below.

As described above, the substrate 10 is supported, with the reverse side 10b facing up, on the annular frame F by the protective tape T. The substrate 10 is placed, with the protective tape T facing down, on the suction chuck 40 on the chuck table 28 of the laser processing apparatus 1 illustrated in FIG. 2. The suction means, not illustrated, is actuated to hold the substrate 10 under suction on the chuck table 28 through the protective tape T. The annular frame F is fixed to the chuck table 28 by the clamps 42.

The chuck table 28 with the substrate 10 held under suction thereon as described above is positioned directly below the image capturing unit 60 by the X-axis moving mechanism 31. When the chuck table 28 is positioned directly below the image capturing unit 60, an alignment process is performed to confirm whether or not the projected dicing lines 14 arranged in a grid pattern on the substrate 10 held on the chuck table 28 are positioned parallel to the X-axis directions and the Y-axis directions and to adjust the orientation of the substrate 10.

As described above, after the alignment process for aligning the substrate 10 held on the chuck table 28 has been performed, an irradiation area setting step is carried out to detect the size of the electrode pads 12a formed on each of the devices 12 and set an irradiation area for the pulsed laser beam LB such that a pore to be formed in a subsequent laser beam applying step will be positioned within the electrode pads 12a. The irradiation area setting step and the laser beam applying step will be described in detail below with reference to FIGS. 4A through 5B.

(Irradiation Area Setting Step)

Figure 4A:
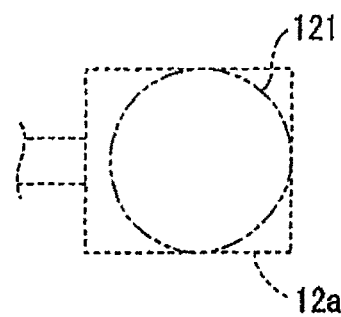
FIGS. 4A and 4B are conceptual views for illustrating a way of carrying out an irradiation area setting step.
Figure 4B:
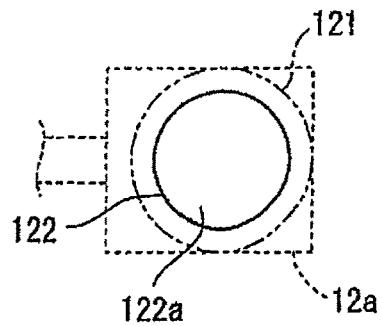
Figure 5A:
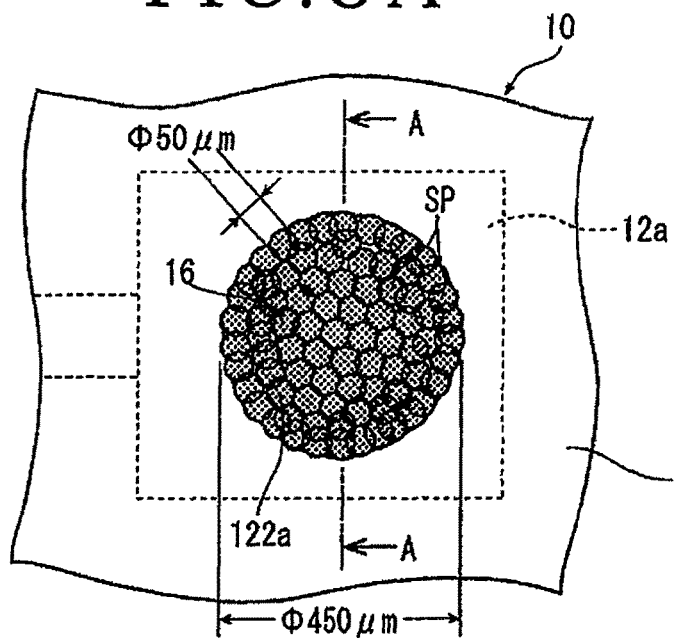
FIG. 5A is a plan view of an electrode pad on which spots of a laser beam are positioned in an irradiation area.
Figure 5B:
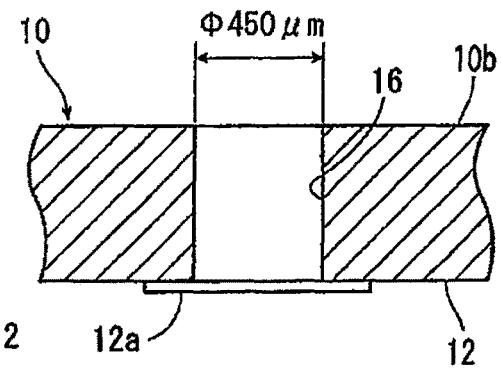
FIG. 5B is a cross-sectional view taken along line A-A of the plan view illustrated in FIG. 5A.

First, one of the electrode pads 12a formed on the device 12 is positioned centrally in an area covered by the image capturing unit 60. As described above, the image capturing unit 60 includes the infrared ray applying means and the infrared image capturing device. As illustrated in FIG. 4A, the infrared image capturing device captures an infrared image of the electrode pad 12a, indicated by the dotted lines, of the device 12 formed on the face side 10a of the substrate 10 when the electrode pad 12a is irradiated with an infrared radiation applied from the infrared ray applying means. Image information captured of the electrode pad 12a by the image capturing unit 60 is transmitted to the control unit 100, which confirms the size, shape, and the like of the electrode pad 12a from the image information. Thereafter, the control unit 100 identifies a circle (an inscribing circle) 121, indicated by the two-dot-and-dash line, inscribed in the rectangular shape of the electrode pad 12a by taking into consideration the rectangular shape of the electrode pad 12a as illustrated in the figure. After having identified the inscribing circle 121, the control unit 100 identifies the diameter of the inscribing circle 121 and calculates the area of the inscribing circle 121. According to the present embodiment, since the diameter of the inscribing circle 121 of the electrode pad 12a is 500 μm, the area of the inscribing circle 121 is calculated as 62,500 Πμm², i.e., 0.0625 Πmm². After having calculated the area of the inscribing circle 121, the control unit 100 calculates a reference value as a maximum value for an area to be set as an irradiation area where the pulsed laser beam LB is to be applied. According to the present embodiment, the reference value is 95% of the area of the inscribing circle 121, and is calculated as follows:

62,500Πμm²×0.95=59,375Πμm²(=0.059375=Πmm²)

Based on the above reference value, the radius of a circle (a reference circle) whose area is represented by the above reference value is calculated as approximately 243.67 μm. According to the present embodiment, therefore, the control unit 100 sets an irradiation area 122a (see FIG. 4B) for the pulsed laser beam LB as equivalent to or smaller than the reference circle whose diameter is 487.34 μm.

According to the present embodiment, with respect to the irradiation area to which the pulsed laser beam LB is to be applied, the control unit 100 sets the irradiation area 122a for the pulsed laser beam LB, whose outer profile is represented by a circle 122 having a diameter of 450 μm, so as to be equivalent to or smaller than the reference circle calculated from the shape and size of the electrode pad 12a described above, as illustrated in FIG. 4B. The irradiation area 122a also has its position set such that its center is aligned with the center of the inscribing circle 121 described above, and is hence inwardly spaced equidistantly from each of the sides of the electrode pads 12a in which the inscribing circle 121 is inscribed. Once the irradiation area 122a on the electrode pad 12a is set, information such as the size or diameter of the circle 122 and the coordinate positions of the center of the circle 122 is stored in the control unit 100 as information corresponding to the electrode pad 12a. The irradiation area setting step described above is repeated with respect to each of the devices 12 and each of the electrode pads 12a formed on the substrate 10, and information about the irradiation areas 122a set with respect to the electrode pads 12a of the devices 12 is stored in the random access memory (RAM) of the control unit 100. The irradiation area setting step is now completed. Upon completion of the irradiation area setting step, the control unit 100 carries out the laser beam applying step for applying the pulsed laser beam LB to the reverse side 10b of the substrate 10 at positions corresponding to the electrode pads 12a.

The irradiation area setting step of the present invention may not necessarily be carried out for each and every one of all the electrode pads 12a to detect the size of each of the electrode pads 12a and to set an irradiation area 122a therefor. Rather, the size of a representative one of the electrode pads 12a of each of the devices 12 may be detected, the size of an irradiation area 122a may be set therefor, and the set size of the irradiation area 122a may be applied as irradiation areas 122a for the other electrode pads 12a. The irradiation area setting step may not necessarily be carried out after the alignment process is finished and may be carried out prior to the alignment process. Furthermore, before the substrate 10 is loaded into the laser processing apparatus 1 illustrated in FIG. 2, images of the electrode pads 12a may be captured in advance from the face side 10a of the substrate 10, and irradiation areas 122a may be set for the respective electrode pads 12a. Moreover, if the manufacturing tolerances involved in the formation of the devices 12 on the substrate 10 are small enough, then irradiation areas 122a is not required to be set by actually capturing images of the electrode pads 12a and the sizes of electrode pads on design drawings may be detected or calculated, and irradiation areas 122a may be set based on the sizes of the electrode pads thus detected or calculated.

(Laser Beam Applying Step)

After the alignment process and the irradiation area setting step have been finished as described above, the laser beam applying step is carried out. The coordinate positions of the devices 12 of the substrate 10 held on the chuck table 28 and the electrode pads 12a have been stored in and managed by the control unit 100. As the alignment process and the irradiation area setting step described above have been carried out, one of the electrode pads 12a on the substrate 10 can be positioned accurately in a desired position.

For forming pores in the substrate 10 from the reverse side 10b thereof that reach the desired electrode pads 12a on the devices 12, one of the devices 12 and one of the electrode pads 12a thereon for which the laser processing method is to be performed are determined. Then, the moving mechanism 30 is actuated to move the chuck table 28 to position the determined electrode pad 12a for forming pores, directly below the beam condenser 52 of the laser beam applying unit 50 based on the coordinate position information of the determined electrode pad 12a that is stored in the control unit 100. After the electrode pad 12a has been positioned directly below the beam condenser 52, the control unit 100 actuates the X-axis moving mechanism 31 to processing-feed the holding unit 20 in one of the X-axis directions at a predetermined speed. The control unit 100 then determines whether or not the irradiation area 122a set with respect to the electrode pad 12a falls within a range that can be irradiated by the pulsed laser beam LB emitted from the beam condenser 52. If the control unit 100 determines that the irradiation area 122a falls within the range that can be irradiated by the pulsed laser beam LB, then the control unit 100 operates the laser beam applying unit 50 to apply the pulsed laser beam LB from the beam condenser 52 to the reverse side 10b of the substrate 10. The area of the substrate 10 that is to be irradiated by the pulsed laser beam LB is the same as the irradiation area 122a set in the irradiation area setting step described above, as illustrated in FIG. 5A. The control unit 100 appropriately controls the voltages applied to the first acousto-optical deflecting means 54 and the second acousto-optical deflecting means 55 to position a spot SP, which has a diameter of 50 μm, of the pulsed laser beam LB successively at uniformly scattered locations, rather than a localized location, within the irradiation area 122a. The pulsed laser beam LB is repeatedly applied to the irradiation area 122a to form a pore 16 having a diameter of 450 μm in the substrate 10 from the reverse side 10b thereof, as can be understood from FIG. 5B that is a cross-sectional view taken along line A-A of FIG. 5A.

In the laser beam applying step, the pulsed laser beam LB is applied to the substrate 10 under the following conditions:
  Laser beam wavelength: 343 nm
  Repetitive frequency: 40 kHz
  Average output power: 2 W
  Pulse duration: 10 ps
  Spot diameter: 50 μm (Detecting step)

At the same time that the laser beam applying step described above is carried out, a detecting step is performed to detect the first plasma light emitted from lithium tantalate of which the substrate 10 is made and the second plasma light emitted from copper of which the electrode pads 12a are made. The detecting step will be described below.

Figure 6:
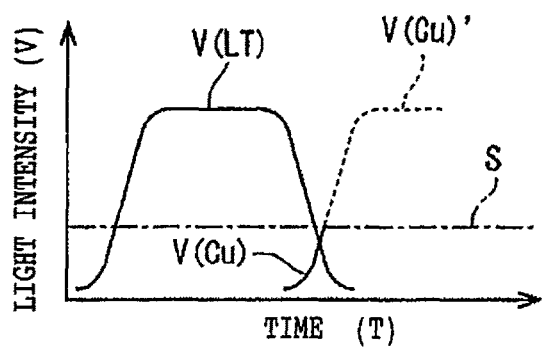
FIG. 6 is a graph illustrating how outputs, i.e., voltage values, of a first photodetector and a second photodetector vary over time.

In the detecting step, while the laser beam applying step described above is being carried out, the first photodetector 74 and the second photodetector 77 of the plasma light detecting unit 70 output respective voltage values representing light intensity signals to the control unit 100. FIG. 6 illustrates the voltage value V (LT) output from the first photodetector 74 that detects the light intensity of the first plasma light and the voltage value V (Cu) output from the second photodetector 77 that detects the light intensity of the second plasma light, as they vary over time. In FIG. 6, the horizontal axis indicates time (T) and the vertical axis indicates the voltage value (V) representing the light intensity.

When the pulsed laser beam LB starts being applied to the irradiation area 122a as described above from the reverse side 10b of the substrate 10, the substrate 10 emits the first plasma light by being irradiated with the pulsed laser beam LB. As illustrated in FIG. 6, the voltage value V (LT) output from the first photodetector 74 starts to rise up to a predetermined voltage value of 2.5 V, for example. Then, the voltage value V (LT) remains substantially constant over time until the pulsed laser beam LB reaches the electrode pad 12a. Thereafter, when the pulsed laser beam LB reaches the electrode pad 12a, the voltage value V (LT) output from the first photodetector 74 starts to fall.

(Laser Beam Irradiation Finishing Step)

According to the detecting step described above, it is possible to detect the state of generation of the first plasma light and the second plasma light. Upon detection of the second plasma light in the detecting step, a laser beam irradiation finishing step is performed to stop application of the pulsed laser beam LB to the substrate 10. The laser beam irradiation finishing step will be described in detail below.

When the pulsed laser beam LB reaches the electrode pad 12a, the voltage value V (Cu) output from the second photodetector 77 starts to rise, as illustrated in FIG. 6. Immediately after the voltage value V (Cu) has started to rise, however, the pore 16 may not have fully extended over the irradiation area 122a in its entirety with respect to the electrode pad 12a. If the pore 16 that is not fully developed is filled up with an electrically conductive material, then there is a risk that the resultant via hole causes a conduction failure. In order to cope with such a risk, according to the present embodiment, a threshold value S of 1.0 V, for example, is set for the voltage value V (Cu) to be output from the second photodetector 77 so as to ascertain that the pore 16 has reached the electrode pad 12a over a sufficient area, as illustrated in FIG. 6. The control unit 100 compares the voltage value V (Cu) to be output from the second photodetector 77 with the threshold value S. If the control unit 100 determines that the voltage value V (Cu) has exceeded the threshold value S, then the control unit 100 decides that the pore 16 has reached the electrode pad 12a over a sufficient area, i.e., the pore 16 has been formed properly, and sends a command signal to the laser beam applying unit 50 to finish applying the pulsed laser beam LB. If the above determining process using the threshold value S is not performed and the laser beam applying step is continued, then the voltage value V (Cu)' further rises up to a voltage value of 2.5 V, for example, and remains substantially constant as illustrated by the dotted line. However, the voltage value V (Cu) that has risen up to the voltage value of 2.5 V is strong enough to form a through hole in the electrode pad 12a. Therefore, the threshold value S is set to be lower than the voltage value of 2.5 V.

The laser beam applying step, the detecting step, and the laser beam irradiation finishing step are performed as described above when the chuck table 28 has been processing-fed in the X-axis direction by the X-axis moving mechanism 31. When a proper pore 16 has been formed in the substrate 10 at a position corresponding to one electrode pad 12a as having reached the electrode pad 12a, the chuck table 28 is processing-fed in the X-axis direction by the X-axis moving mechanism 31 to position a next electrode pad 12a adjacent to the abovementioned electrode pad 12a in the X-axis direction under the irradiation area 122a of the pulsed laser beam LB directly below the beam condenser 52. If it is determined that the next electrode pad 12a has been positioned under the irradiation area 122a of the pulsed laser beam LB, then the laser beam applying step, the detecting step, and the laser beam irradiation finishing step described above are performed again. The above process is repeated until proper pores 16 are formed in the substrate 10 at respective positions corresponding to all the electrode pads 12a arrayed in the X-axis direction. When the pores 16 have been formed in the substrate 10 at the respective positions corresponding to all the electrode pads 12a arrayed in the X-axis direction, the Y-axis moving mechanism 32 is actuated to indexing-feed the substrate 10 in one of the Y-axis directions. Then, the laser beam applying step, the detecting step, and the laser beam irradiation finishing step are repeated on arrays of electrode pads 12a adjacent in the Y-axis direction to form proper pores 16 in the substrate 10 at respective positions corresponding to the electrode pads 12a. The above process is repeated until proper pores 16 are formed in the substrate 10 at respective positions corresponding to all the electrode pads 12a formed on the substrate 10.

According to the present embodiment, as described above, in the irradiation area setting step, the size of an electrode pad 12a is detected, and the irradiation area 122a for the pulsed laser beam LB is set so as to position a pore 16 to be formed within the electrode pad 12a. When the pore 16 thus positioned has been formed in the substrate and has reached the electrode pad 12a, the pulsed laser beam LB is reliably applied to the electrode pad 12a. Therefore, the second plasma light is sufficiently emitted from the electrode pad 12a and reliably detected. Since the application of pulsed laser beam LB is stopped upon detection of the second plasma light, the pore 16 is properly formed in the substrate 10 without making a hole in the electrode pad 12a. In the irradiation area setting step, it is preferable to set the irradiation area 122a such that the irradiation area 122a is equal to or less than 95% of the area of the circle 122 inscribed in the rectangular shape of the electrode pad 12a. The reasons for setting the irradiation area 122a to such a value will be described below.

The inventors of the present invention conducted experiments described below in order to examine a preferable size of the irradiation area 122a for forming a proper pore 16 in the substrate 10 by applying the pulsed laser beam LB to the substrate 10 from the reverse side 10b thereof at a position corresponding to an electrode pad 12a. Processing conditions used in the experiments, other than variable parameters, were in accord with the processing conditions according to the present embodiment described above. Consequently, those processing conditions will not be described in detail below.
<Experiment 1>

An irradiation area represented by a circle having a diameter of 524 μm was set such that the area of the circle representing the irradiation area 122a was approximately 110% of the area of a circle having a diameter of 500 μm that was inscribed in the rectangular shape of an electrode pad 12a on a substrate 10. Using the irradiation area thus set, a pore 16 was formed in the substrate 10 under the same conditions as those described in the above embodiment. As a result, a through hole was formed in the electrode pad 12a.
<Experiment 2>

An irradiation area represented by a circle having a diameter of 500 μm was set such that the area of the circle representing the irradiation area 122a was approximately 100% of the area of a circle having a diameter of 500 μm that was inscribed in the rectangular shape of an electrode pad 12a on a substrate 10. Using the irradiation area thus set, a pore 16 was formed in the substrate 10 under the same conditions as those described in the above embodiment. As a result, a through hole was formed in the electrode pad 12a although the through hole was smaller than the through hole formed in Experiment 1.
<Experiment 3>

An irradiation area represented by a circle having a diameter of 490 μm was set such that the area of the circle representing the irradiation area 122a was approximately 96% of the area of a circle having a diameter of 500 μm that was inscribed in the rectangular shape of an electrode pad 12a on a substrate 10. Using the irradiation area thus set, a pore 16 was formed in the substrate 10 under the same conditions as those described in the above embodiment. As a result, a depression was found but no through hole was formed in the electrode pad 12a.

From the results of the above experiments, the inventors found out that in order to form a proper pore 16 in the substrate 10 without making a hole in the electrode pad 12a by detecting the second plasma light, the area of a circle representing the irradiation area 122a should be set smaller than the area of the inscribing circle 121 inscribed in the electrode pad 12a in the irradiation area setting step, and particularly that the irradiation area 122a should preferably be equal to or less than 95% of the area of the inscribing circle 121. Using the irradiation area 122a thus set, the second plasma light can sufficiently be detected, and a proper pore 16 can be formed in the substrate 10 without making a hole in the electrode pad 12a.

In the embodiment described above, the substrate 10 is made of lithium tantalate. However, the present invention is not limited to such details. The substrate 10 may be made of any of other materials including silicon, lithium niobate (LN), glass, and so on. If the substrate 10 is made of any of those other materials, then since the wavelength of the first plasma light varies depending on the material of the substrate 10, the wavelength passband of the first bandpass filter 73 is adjusted accordingly. The electrode pads 12a are generally made of copper. However, the present invention does not preclude other materials including, for example, gold, as the material of the electrode pads 12a. If the electrode pads 12a are made of any of those other materials, then the wavelength passband of the second bandpass filter 76 is adjusted accordingly, as with the first bandpass filter 73.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for applying a laser beam to a reverse side of a substrate with a device and an electrode pad on a face side of the substrate, to form a pore in the substrate that leads to the electrode pad, the method comprising:
   an irradiation area setting step of detecting the size of the electrode pad and defining a outer section on the electrode pad, and setting an irradiation area for the laser beam within said outer section, such that the pore to be formed is positioned within the irradiation area on the electrode pad;
   a laser beam applying step, after the irradiation area setting step, of applying the laser beam to the reverse side of the substrate to form a pore in the substrate at a position corresponding to the electrode pad;
   a detecting step of detecting first plasma light emitted from the substrate at the same time when the pore is formed in the substrate by the laser beam applied thereto, and detecting second plasma light emitted from the electrode pad; and a laser beam irradiation finishing step of stopping application of the laser beam to the reverse side of the substrate when the second plasma light is detected in the detecting step.

2. The laser processing method according to claim 1, wherein in the irradiation area setting step, further comprises inscribing a circle in the electrode pad that defines the outer section, wherein the irradiation area for the laser beam is set such that the pore formed in the substrate and leading to the electrode pad has a cross-sectional area that is equal to or less than 95% of the area of the circle inscribed in the electrode pad.

3. The laser processing method according to claim 1, wherein the detecting step includes outputting signals to a control unit, where the signals are representative of voltage values commensurate with light intensities associated with the first plasma light and the second plasma light.

4. The laser processing method according to claim 3, further comprising setting a threshold voltage value associated with the second plasma light, wherein the pore is determined to be formed properly in the substrate when the voltage value associated with the second plasma light is equal to or greater than the threshold voltage value.

* * * * *